Dec. 24, 1968 C. F. BANCROFT 3,418,496

PHASE COMPARATOR CIRCUIT

Filed June 3, 1966 2 Sheets-Sheet 1

PRIOR ART FIG. 1

INVENTOR.
CHARLES F. BANCROFT,
BY
J. K. Haskell
ATTORNEY.

PHASE COMPARATOR CIRCUIT

Filed June 3, 1966 2 Sheets-Sheet 2

INVENTOR.
CHARLES F. BANCROFT,
BY J. K. Haskell
ATTORNEY.

United States Patent Office 3,418,496
Patented Dec. 24, 1968

3,418,496
PHASE COMPARATOR CIRCUIT

Charles F. Bancroft, Sherman Oaks, Calif., assignor to Hughes Aircraft Company, Culver City, Calif., a corporation of Delaware
Filed June 3, 1966, Ser. No. 555,110
6 Claims. (Cl. 307—232)

This invention relates to phase comparators, and more particularly relates to a novel and improved phase comparator circuit which also provides amplification.

In numerous systems employing phase locked loops it is necessary to amplify signals to be phase compared prior to applying them to a conventional phase detector which provides the required phase comparison. Such signal amplification necessitates the inclusion of additional circuitry into the system, thereby adding to its size and weight.

Accordingly, it is an object of the present invention to provide a phase detector circuit which is operable in a phase locked loop system without the amplification circuitry which was necessary with prior art phase detectors.

It is a further object of the present invention to provide a phase comparator circuit which is operable over a wide range of frequencies and which provides amplification in addition to phase comparison.

It is a still further object of the present invention to provide a circuit which provides an indication of the phase difference between a pair of input signals whose frequencies are harmonically related to one another.

In accordance with the objects set forth above, the phase comparator of the present invention includes first and second transistors of the same conductivity type and a third transistor of a conductivity type complementary to that of the first and second transistors. The emitter electrodes of the first and second transistors are connected together, and the collector electrode of the second transistor is connected to the base electrode of the third transistor. First and second alternating signals the phases of which are to be compared are applied to the respective base electrodes of the first and second transistors. Operating potentials are applied between the collector and emitter electrodes of each of the first and third transistors, and a bias signal is applied to the base electrode of the second transistor. A feedback resistor is connected between the collector electrode of the third transistor and the base electrode of the first transistor. An amplified output signal indicative of the phase difference between the first and second alternating signals is obtained from the collector electrode of the third transistor.

Figure 1:
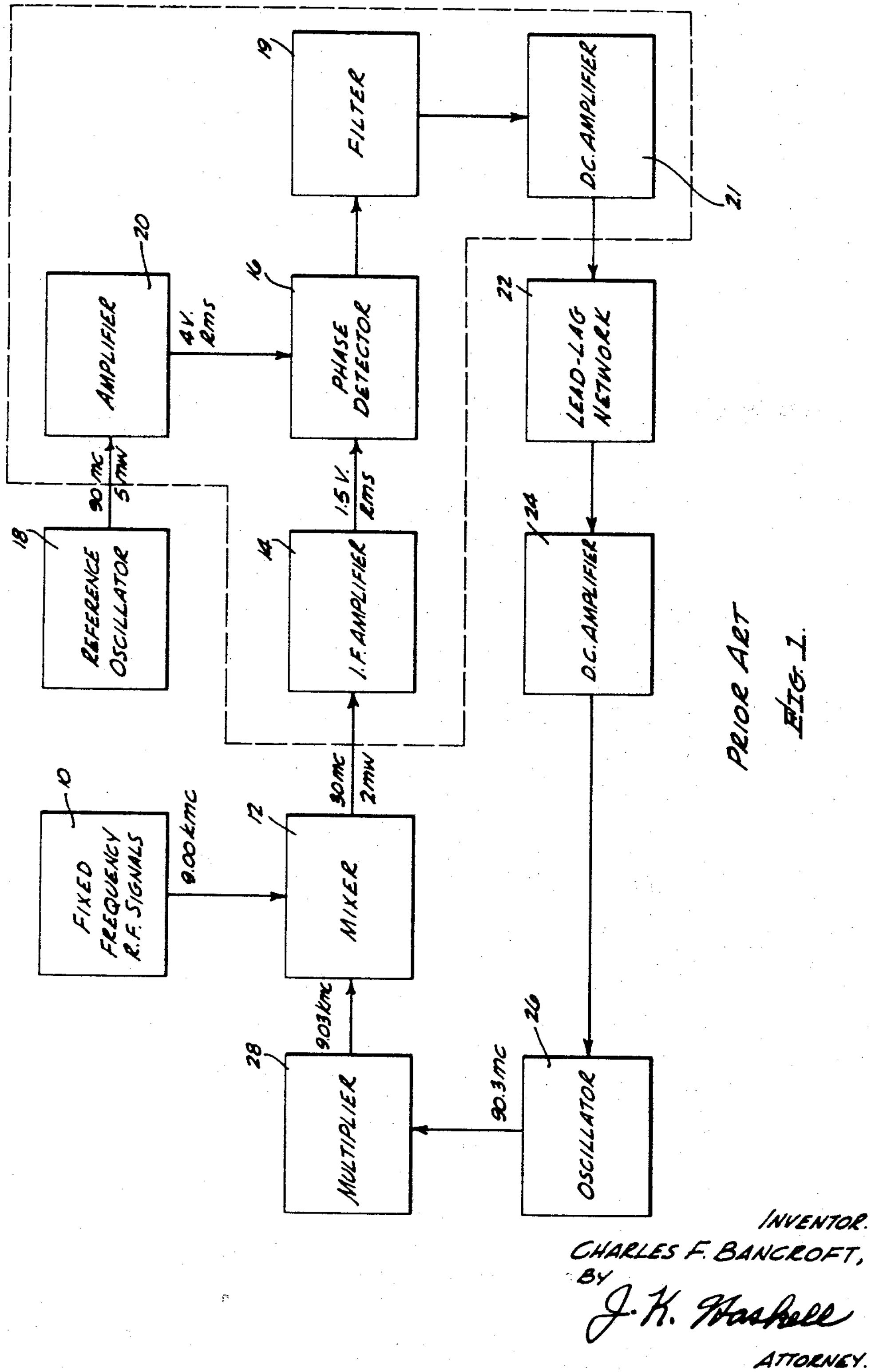
Figure 2:
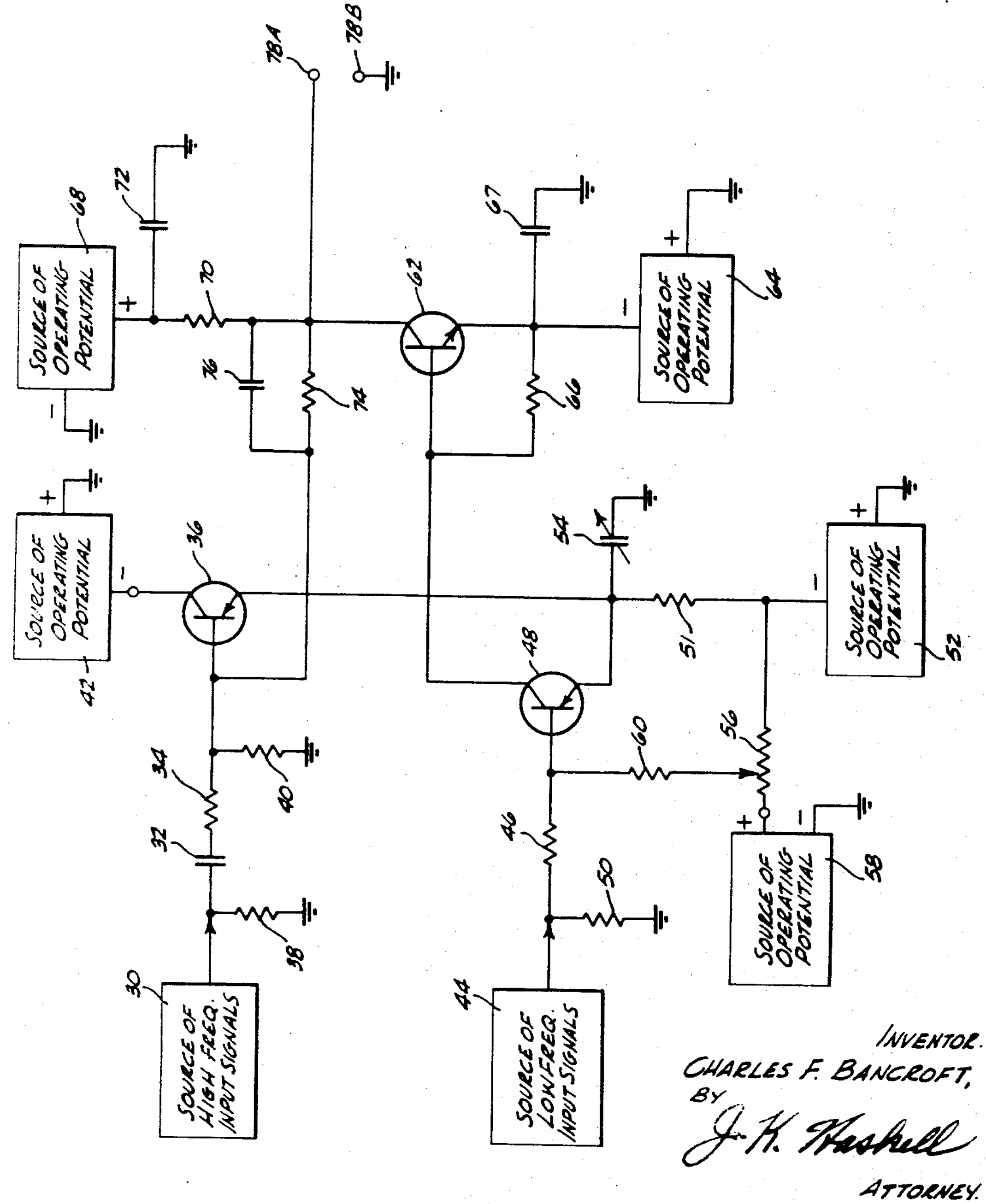

Additional objects, advantages, and characteristic features of the present invention will become readily apparent from the following detailed description of a preferred embodiment of the invention when considered in connection with the accompanying drawing in which:

FIG. 1 is a block diagram illustrating a portion of a typical phase locked loop system in accordance with the prior art, and which may incorporate a phase comparator in accordance with the present invention; and FIG. 2 is a schematic circuit diagram illustrating a phase comparator in accordance with the invention.

In FIG. 1 there is shown a block diagram of a portion of a system, such as a radar receiver, which employs a phase locked loop. Such a system includes a source 10 of fixed frequency RF signals which, by way of example, may be on the order of 9.00 kmc. These signals are applied to a mixer 12 which receives as its second input a 9.03 kmc. signal so that the output of the mixer 12 is a 30 mc. signal. This 30 mc. signal is applied to an IF amplifier 14 which amplifies the 30 mc. signal to a level usually around 1.5 volts RMS. The amplified 30 mc. signal is then applied as the first input to a phase detector 16.

A reference oscillator 18 generates an output signal at 90 mc. which, after being amplified to a level of about 4 volts RMS in an amplifier 20, is applied as the second input to the phase detector 16. The phase detector 16 converts a constant phase difference between the 30 mc. IF signal and the 90 mc. reference signal to a DC output voltage, which is applied to a 30 mc. filter 19, the output of which is applied to a DC amplifier 21. The filter 19 prevents IF leakage which may pass through the phase detector 16 from reaching the DC amplifier 21 to prevent rectification thereof. The output of the DC amplifier 21 is applied to a lead-lag network 22 which establishes the proper loop phase-gain relationships to provide the desired loop stability.

The output of the lead-lag network 22 is applied to a DC amplifier 24. The output of the DC amplifier 24 is applied as an error signal to control the frequency of an oscillator 26, which may be a voltage controlled crystal oscillator, to maintain its frequency of oscillation at 90.3 mc. The output of the oscillator 26 is applied to a multiplier 28, which multiplies the output frequency from the oscillator 26 up to 9.03 kmc. The output of the multiplier 28 may be used as the second input to the mixer 12.

The arrangement shown in FIG. 1 requires that the 30 mc. and 90 mc. signals from the mixer 12 and the reference oscillator 18, respectively, be amplified to a relatively high level in order to properly drive a typical phase detector of the prior art. However, the phase detector circuit of the present invention may replace all of those elements shown within the dashed lines in FIG. 1, because the phase detector of the present invention is drivable with relatively low level signals and provides its own amplification. Thus, it will be apparent that the phase detector of the present invention achieves a substantial reduction in the number of circuit components required, thereby affording considerable savings in space and weight. In fact, when made in integrated circuit form, the phase detector of the invention may be so small that it fits into a cylindrical container ⅜ inch in diameter and ¼ inch in height.

The phase comparator circuit of the present invention is illustrated in FIG. 2. As is shown in this figure, a source 30 of high frequency input signals, which may be signals derived from the reference oscillator 18 of FIG. 1 for example, is connected via a series capacitor 32 and resistor 34 to the base electrode of a first PNP transistor 36. A resistor 38 connects the input terminal of capacitor 32 to ground, and a resistor 40 is connected between the base electrode of transistor 36 and ground. The collector electrode of transistor 36 is connected to the negative terminal of a source of operating potential 42.

A source 44 of low frequency input signals, which may correspond to the output of the mixer 12 for example, is connected through a resistor 46 to the base electrode of a second PNP transistor 48. A resistor 50 connects the input terminal of resistor 46 to ground. The emitter electrodes of transistors 36 and 48 are connected together and through a resistor 51 to the negative terminal of a source of operating potential 52. A variable capacitor 54 is connected between the emitter electrodes of the transistors 36 and 48 and ground. A bias is established for transistor 48 by means of a potentiometer 56 which is connected between the positive terminal of a source of operating potential 58 and the negative terminal of the source of operating potential 52. The potentiometer 56 has a movable tap which is connected via a resistor 60 to the base electrode of transistor 48.

A third transistor 62, which is of the NPN type, has its base electrode connected to the collector electrode of transistor 48. A source of operating potential 64 has its negative terminal connected to the emitter electrode of transistor 62 and also connected via a resistor 66 to the base electrode of transistor 62, the positive terminal of the source 64 being connected to ground. A capacitor 67 is connected between the emitter electrode of transistor 62 and ground. A source of operating potential 68 has its positive terminal connected through a resistor 70 to the collector electrode of transistor 62. A decoupling capacitor 72 is connected between the positive terminal of the source of operating potential 68 and ground.

A feedback resistor 74 is connected between the collector electrode of transistor 62 and the base electrode of transistor 36, a by-pass capacitor 76 being connected in parallel with the resistor 74 to provide circuit stability at high frequencies. A DC output signal from the phase detector, which has a magnitude indicative of the difference in phase between the signals from the respective sources 30 and 44, is obtained between a pair of output terminals 78A and 78B. Output terminal 78A is connected to the collector electrode of transistor 62, while output terminal 78B is connected to ground.

The DC operating level of the circuit of FIG. 2 may be adjusted to a desired value by adjustment of the potentiometer 56. The capacitor 54 may be adjusted to minimize the effects of stray capacitance. The gain of the circuit and the operating point of transistor 62 is determined by the relative values of resistors 40 and 74. With the circuit shown, in order to detect the phase difference between a 90 mc. signal and a 30 mc. signal, the 90 mc. input power required is no more than 5 milliwatts and the 30 mc. input power required is no more than 2 milliwatts for a 2 volt peak-to-peak phase detected output signal.

As illustrative of an embodiment of the present invention which has been built and operated successfully, the following exemplary component values are set forth for the circuit of FIG. 2. It is pointed out, however, that these exemplary values are included solely for illustrative purposes and are in no way intended to serve as a limitation upon the invention.

| Resistors: | Ohms |
|---|---|
| 38 | 51 |
| 40 | 120 |
| 50 | 51 |
| 51 | 3.3K |
| 56 | 10K |
| 60 | 1K |
| 66 | 560 |
| 70 | 500 |
| 74 | 2.4K |

| Capacitors: | Picofarads |
|---|---|
| 32 | 1000 |
| 54 | 1–40 |
| 67 | 1000 |
| 72 | 1000 |
| 76 | 1 |

Potential sources:
42, 52, 58, 64, 68 ---------- all 12 volts.

| Transistors: | |
|---|---|
| 36 | 2N3307 |
| 48 | 2N3307 |
| 62 | 2N2369 |

| Input signals: | |
|---|---|
| From 30 | 5 mw. at 90 mc. |
| From 44 | 2 mw. at 30 mc. |

Although the theory of the operation of the phase detector of the present invention is not completely understood at this time, it is believed that the circuit operates by rectification across the base-emitter junctions of the transistors 36 and 48, with amplification of the input signals being provided by transistors 36, 48 and 62. This lack of full understanding is due in part to the surprising fact that the circuit can operate to provide phase detection and amplification of the phase detected signal with input frequencies considerably above the cutoff frequency $f_a$ of the transistors 36 and 48, the frequency $f_a$ being defined in accordance with the IRE Dictionary of Electronics Terms and Symbols, 1961, as the frequency at which the magnitude of the small-signal short-circuit forward current transfer ratio is 0.707 of the low frequency value.

It is further pointed out that it is desirable that the frequency of one of the input signals to the phase detector of the invention be an integral multiple of the frequency of the other input signal, and the circuit has been operated successfully with frequency ratios as high as ten-to-one with input frequencies ranging from 30 mc. to 1000 mc.

Although the invention has been shown and described with reference to a particular embodiment, nevertheless various changes and modifications obvious to a person skilled in the art to which the invention pertains is deemed to lie within the spirit, scope and contemplation of the invention as set forth in the appended claims.

What is claimed is:

1. A phase comparator circuit comprising: first, second and third transistors each having an emitter electrode, a base electrode, and a collector electrode; said first and second transistors being of the same conductivity type and said third transistor being of a conductivity type complementary to that of said first and second transistors; the emitter electrodes of said first and second transistors being connected together and the collector electrode of said second transistor being connected to the base electrode of said third transistor; means for applying a first alternating signal to the base electrode of said first transistor; means for applying a second alternating signal the phase of which is to be compared with that of said first alternating signal to the base electrode of said second transistor; means for applying operating potentials between the collector and the emitter electrodes of said first and third transistors, means for applying a bias signal to the base electrode of said second transistor; a feedback resistor connected between the collector electrode of said third transistor and the base electrode of said first transistor; and means for obtaining from the collector electrode of said third transistor an output signal having a magnitude indicative of the phase difference between said first and second alternating signals.

2. A phase comparator circuit according to claim 1 wherein said means for applying operating potentials includes a source of operating potential having first and second terminals, a first resistor connected between said first terminal and the collector electrode of said third transistor, said second terminal being connected to the collector electrode of said first transistor and to the emitter electrode of said third transistor, and a second resistor connected between said second terminal and the emitter electrodes of said first and second transistors.

3. A phase comparator circuit according to claim 2 wherein said means for applying a bias signal to the base electrode of said second transistor includes a potentiometer connected between said first and second terminals, said potentiometer having a movable tap connected to the base electrode of said second transistor.

4. A phase comparator circuit according to claim 1 wherein the frequency of said first alternating signal is essentially an integral multiple of the frequency of said second alternating signal.

5. A phase comparator circuit according to claim 1 wherein the frequency of each of said first and second alternating signals is higher than the cutoff frequency $f_a$ for said first and second transistors.

6. A phase comparator circuit comprising: first, second and third transistors each having an emitter electrode, a base electrode, and a collector electrode; said first and second transistors being of the same conductivity type and said third transistor being of a conductivity type complementary to that of said first and second transistors;

the emitter electrodes of said first and second transistors being connected together and the collector electrode of said second transistor being connected to the base electrode of said third transistor; first and second sources of alternating signals, the frequency of the signal provided by said first source being essentially an integral multiple of the frequency of the signal provided by said second source; a source of potential having first, second and third terminals; a first resistor connected between said first terminal and the collector electrode of said third transistor; said second terminal being connected to the collector electrode of said first transistor and to the emitter electrode of said third transistor; a second resistor connected between said second terminal and the emitter electrodes of said first and second transistors; a third resistor connected between the base and emitter electrodes of said third transistor; a fourth resistor and a first capacitor connected in parallel between the collector electrode of said third transistor and the base electrode of said first transistor; a fifth resistor connected between the base electrode of said first transistor and said second terminal; a sixth resistor and a second capacitor connected in series between said first source of alternating signals and the base electrode of said first transistor; a seventh resistor connected between said second source of alternating signals and the base electrode of said second transistor; a potentiometer connected between said first and second terminals; said potentiometer having a movable tap; an eighth resistor connected between said movable tap and the base electrode of said second transistor; and means for obtaining between the collector electrode of said third transistor and said third terminal an output signal having a magnitude indicative of the phase difference between said first and second alternating signals.

References Cited

UNITED STATES PATENTS 3,330,972 8/1967 Malan ------------- 307—232

ARTHUR GAUSS, *Primary Examiner.*

J. D. FREW, *Assistant Examiner.*

U.S. Cl. X.R.

328—133; 329—50